(12) United States Patent
Sakai (10) Patent No.: US 7,365,484 B1
(45) Date of Patent: Apr. 29, 2008

(54) PATTERNED SUBSTRATE, ELECTRO-OPTICAL DEVICE, AND METHOD FOR MANUFACTURING AN ELECTRO-OPTICAL DEVICE

(75) Inventor: Hirofumi Sakai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 28 days.

(21) Appl. No.: 11/302,160

(22) Filed: Dec. 14, 2005

(30) Foreign Application Priority Data

Dec. 21, 2004 (JP) .............................. 2004-368871

(51) Int. Cl.
*H01J 63/04* (2006.01)
(52) U.S. Cl. .................... 313/498; 313/503; 445/23
(58) Field of Classification Search .............. 313/483, 313/498–512; 445/23–25
See application file for complete search history.

(56) References Cited

U.S. PATENT DOCUMENTS

| | | | | |
|---|---|---|---|---|
| 6,995,432 B2* | 2/2006 | Yamazaki et al. | .......... | 257/359 |
| 2003/0107036 A1* | 6/2003 | Yamazaki et al. | ............ | 257/57 |
| 2004/0018748 A1* | 1/2004 | Lu et al. | ..................... | 438/778 |
| 2004/0075384 A1* | 4/2004 | Aoki | .......................... | 313/506 |
| 2004/0124770 A1* | 7/2004 | Hayashi et al. | ............. | 313/506 |
| 2004/0155578 A1* | 8/2004 | Ito et al. | ..................... | 313/506 |
| 2004/0239853 A1* | 12/2004 | Sakurada | .................... | 349/122 |
| 2005/0003640 A1 | 1/2005 | Ushiyama et al. | | |
| 2005/0245079 A1* | 11/2005 | Honda et al. | ............... | 438/676 |
| 2006/0087228 A1* | 4/2006 | Kobayashi | .................. | 313/504 |

FOREIGN PATENT DOCUMENTS

| | | |
|---|---|---|
| JP | 2004-133031 A | 4/2004 |
| JP | 2005-046828 A | 2/2005 |
| KR | 2004-0103345 A | 12/2004 |

* cited by examiner

*Primary Examiner*—Joseph L Williams
(74) *Attorney, Agent, or Firm*—Global IP Counselors, LLP (57) ABSTRACT

A patterned substrate includes a base layer; a droplet holding space surrounded by a barrier that is formed over the base layer; and a pattern formed by discharging droplets containing a pattern formation material into the droplet holding space surrounded by the barrier. A recess that is lyophilic with respect to the droplets and that expands outward in a planar direction of the base layer is provided on a base layer side of the barrier.

20 Claims, 10 Drawing Sheets

PATTERNED SUBSTRATE, ELECTRO-OPTICAL DEVICE, AND METHOD FOR MANUFACTURING AN ELECTRO-OPTICAL DEVICE

BACKGROUND

1. Technical Field

The present invention relates to a patterned substrate, an electro-optical device, and a method for manufacturing an electro-optical device.

2. Related Art

Known displays equipped with light emitting elements include organic electroluminescence displays (organic EL displays) used as an electro-optical device equipped with an organic electroluminescence element (organic EL element).

Methods for manufacturing organic EL elements are generally classified by the kind of material that makes up the organic EL layer thereof. When the material that makes up the organic EL layer is a low-molecular weight organic material, a vapor phase process is utilized, in which the organic EL layer is formed by the vapor deposition of this low-molecular weight organic material. On the other hand, when the material that makes up the organic EL layer is a high-molecular weight organic material, a liquid phase process is utilized, in which the high-molecular weight organic material is dissolved in an organic solvent or the like, and a coating of this solution is applied and dried.

With an inkjet method, which is a type of liquid phase process, tiny droplets (micro-droplets) of solution are discharged, so the location where the organic EL layer is formed, the film thickness, and the like can be controlled more precisely than with other liquid phase processes (such as spin coating).

With an inkjet method, however, the shape of the pattern after drying is affected by the shape of the micro-droplets that land on the pattern formation surface. Consequently, if the micro-droplets that land are not flat in shape (if they have a convex hemispherical shape, for instance), this can lead to the problem of non-uniform pattern shape.

In view of this, it has been proposed in the past that the uniformity of this pattern shape be increased with an inkjet method (see JP-A-2004-133031, for example). In Patent JP-A-2004-133031, the pattern formation surface is bounded by a first film (first barrier) that is lyophilic with respect to the droplets, and a second barrier that repels the droplets is formed over this first barrier. The second barrier forms a droplet holding space that holds the droplets, and droplets that go through this droplet holding space and land on the pattern formation surface wet and spread out over the surface due to the surface tension of the first barrier. This improves the uniformity of the shape of the pattern formed on the pattern formation surface.

With JP-A-2004-133031, however, since the first barrier is formed in the same size as the droplet holding space, the range over which the surface tension of the first barrier works is limited to the size of the inner periphery of the droplet holding space (second barrier). Consequently, this can lead to a problem in that the discharged droplets do not wet and spread out over the outer periphery of the pattern formation surface.

Therefore, if the contact range of this first barrier with respect to the droplets could be expanded, the droplets that landed on the pattern formation surface would be better able to wet and spread out over the surface, which in turn would improve the shape uniformity of the pattern formed by the droplets.

SUMMARY

An advantage of the invention is to provide a patterned substrate, an electro-optical device, and a method for manufacturing an electro-optical device, with which the shape uniformity of a pattern formed by droplets is increased.

The patterned substrate of an aspect of the invention is furnished with a base layer; a droplet holding space surrounded by a barrier that is formed over the base layer; and a pattern formed by discharging droplets containing a pattern formation material into the droplet holding space surrounded by the, wherein a recess that expands outward in the planar direction of the base layer is provided on the base layer side of the barrier.

With this patterned substrate, because a lyophilic recess is formed, the area that is lyophilic to the droplets is correspondingly larger, and because the droplets will be drawn into this recess, there will be a corresponding improvement in how well the droplets discharged into the droplet holding space wet and spread out over the surface outward in the planar direction of the base layer. Therefore, the pattern can be formed in a more uniform shape, which in turn improves the productivity of the patterned substrate.

In this patterned substrate, the barrier preferably includes a first barrier formed over the base layer and a second barrier formed over the first barrier, the droplet holding space is formed by the second barrier, and the recess is formed by the first barrier, which is located farther outside in the planar direction than the second barrier.

With this patterned substrate, because the first barrier is located farther outside in the planar direction of the base layer than the second barrier, there is a corresponding improvement in how well the droplets discharged into the droplet holding space wet and spread out over the surface outward in the planar direction of the base layer.

In this patterned substrate, the first barrier is preferably formed such that it widens outward in the planar direction from a position across from the droplet holding space of the base layer toward the second barrier.

With this patterned substrate, because the first barrier is formed so that it widens from a position across from the droplet holding space toward the second barrier, the area that is lyophilic to the droplets is correspondingly larger, and the droplets discharged into the droplet holding space wet and spread out more effectively.

In this patterned substrate, the first barrier is formed such that it narrows outward in the planar direction from a position across from the droplet holding space of the base layer toward the second barrier.

With this patterned substrate, because the first barrier is formed such that it narrows from a position across from the droplet holding space of the base layer toward the second barrier, the area that is lyophilic to the droplets is correspondingly larger, and the droplets discharged into the droplet holding space wet and spread out more effectively.

In this patterned substrate, the first barrier is lyophilic with respect to the droplets, and the second barrier repels the droplets.

With this patterned substrate, because the second barrier repels the droplets, the droplets discharged into the droplet holding space can be guided more effectively to the first barrier side. Therefore, the uniformity of the pattern shape can be further improved.

In this patterned substrate, the pattern formation material is preferably a light emitting element formation material, and the pattern is a light emitting element.

With this patterned substrate, a light emitting element can be formed in a more uniform shape, and the productivity of a patterned substrate equipped with this light emitting element can be increased.

In this patterned substrate, the pattern formation material is a color filter formation material, and the pattern is a color filter.

With this patterned substrate, a color filter can be formed in a more uniform shape, and the productivity of a patterned substrate equipped with this color filter can be increased.

The electro-optical device of another aspect of the invention is equipped with a light emitting element formed by discharging droplets containing a light emitting element formation material into a droplet holding space surrounded by a barrier formed on a base layer, wherein a recess that is lyophilic with respect to the droplets and expands outward in the planar direction of the base layer is formed on the base layer side of the barrier.

With the electro-optical device of this aspect of the invention, because a lyophilic recess is formed, the area that is lyophilic to the droplets is correspondingly larger, and because the droplets will be drawn into this recess, there will be a corresponding improvement in how well the droplets discharged into the droplet holding space wet and spread out over the surface outward in the planar direction of the base layer. Therefore, the pattern can be formed in a more uniform shape, which in turn improves the productivity of the electro-optical device.

In this electro-optical device, the barrier preferably includes a first barrier formed over the base layer and a second barrier formed over the first barrier, the droplet holding space is formed by the second barrier, and the recess is formed by the first barrier, which is located farther outside in the planar direction than the second barrier.

With this electro-optical device, because the first barrier is located farther outside in the planar direction of the base layer than the second barrier, there is a corresponding improvement in how well the droplets discharged into the droplet holding space wet and spread out over the surface outward in the planar direction of the base layer.

In this electro-optical device, the first barrier is formed such that it widens outward in the planar direction from a position across from the droplet holding space of the base layer toward the second barrier.

With this electro-optical device, since the first barrier is formed in a position across from the droplet holding space, the droplets discharged into the droplet holding space can be guided more effectively to the first barrier side. Therefore, the uniformity of the pattern shape can be further improved.

In this electro-optical device, the first barrier is preferably lyophilic with respect to the droplets, and the second barrier repels the droplets.

With this electro-optical device, because the second barrier repels the droplets, the droplets discharged into the droplet holding space can be guided more effectively to the first barrier side. Therefore, the uniformity of the pattern shape can be further improved.

In this electro-optical device, the light emitting element is preferably an electroluminescence element equipped with a light emitting layer between a transparent electrode and a back electrode.

With this electro-optical device, the uniformity of the shape of an electroluminescence element can be improved, and the productivity of an electro-optical device equipped with this electroluminescence element can be increased.

In this electro-optical device, the light emitting element is preferably an organic electroluminescence element equipped with a light emitting layer composed of an organic material.

With this electro-optical device, the uniformity of the shape of an organic electroluminescence element can be improved, and the productivity of an electro-optical device equipped with this organic electroluminescence element can be increased.

In this electro-optical device, the base layer is preferably either the transparent electrode or the back electrode.

With this electro-optical device, there is better uniformity in the light emitting layer formed over a transparent electrode or a back electrode.

The method for manufacturing an electro-optical device of still another aspect of the invention includes forming on a base layer a droplet holding space surrounded by a barrier; and forming a light emitting element by discharging droplets containing a light emitting element formation material into the droplet holding space, wherein a recess that is lyophilic with respect to the droplets and expands outward in the planar direction of the base layer is formed on the base layer side of the barrier prior to the discharge of the droplets.

With the method of this aspect of the invention for manufacturing an electro-optical device, because a lyophilic recess is formed, the area that is lyophilic to the droplets is correspondingly larger, and because the droplets will be drawn into this recess, there will be a corresponding improvement in how well the droplets discharged into the droplet holding space wet and spread out over the surface outward in the planar direction of the base layer. Therefore, a light emitting element can be formed in a more uniform shape, which in turn improves the productivity of the electro-optical device.

In the method for manufacturing an electro-optical device, the barrier preferably includes a second barrier that forms the droplet holding space, and a first barrier that is in between the second barrier and the base layer and forms the recess, and a second barrier layer laminated over a first barrier layer on the base layer is patterned to form the second barrier surrounding the droplet holding space, after which the first barrier layer is patterned to form the first barrier positioned farther outside in the planar direction than the second barrier.

With this method for manufacturing an electro-optical device, the second barrier is formed and then the first barrier is formed outward in the planar direction of this second barrier, so the recess that is lyophilic to the droplets can be expanded more effectively than the droplet holding space. Therefore, the droplets discharged into the droplet holding space can more effectively wet and spread out over the surface outward in the planar direction of the base layer.

In this method for manufacturing an electro-optical device, the first barrier is preferably formed by using the second barrier as a mask and isotropically etching the first barrier layer.

With this method for manufacturing an electro-optical device, since the first barrier layer is isotropically etched using the second barrier as a mask, the first barrier can be formed so that it widens outward in the planar direction from a position across from the droplet holding space toward the second barrier. Therefore, the droplets discharged into the droplet holding space can wet and spread out more effectively. Furthermore, the formation of a mask for forming the first barrier and other such steps can be eliminated, and as a result the uniformity of the shape of a light emitting element can be improved, and the productivity of the electro-optical device can be increased.

In this method for manufacturing an electro-optical device, the base layer is preferably either a transparent electrode or a back electrode, and the light emitting element is an electroluminescence element having a light emitting layer between the transparent electrode and the back electrode.

With this method for manufacturing an electro-optical device, the uniformity of the shape of an electroluminescence element can be improved, and the productivity of an electro-optical device equipped with this electroluminescence element can be increased.

In this method for manufacturing an electro-optical device, the light emitting element is preferably an organic electroluminescence element equipped with a light emitting layer composed of an organic material.

With this method for manufacturing an electro-optical device, the uniformity of the shape of an organic electroluminescence element can be improved, and the productivity of an electro-optical device equipped with this organic electroluminescence element can be increased.

In this method for manufacturing an electro-optical device, the droplets are preferably discharged from a droplet discharge apparatus.

With this method for manufacturing an electro-optical device, because fine droplets are formed by a droplet discharge apparatus, there will be a corresponding increase in the uniformity of shape in which a light emitting element is formed, and the productivity of the electro-optical device can be increased.

DESCRIPTION OF EXEMPLARY EMBODIMENTS

Figure 1:
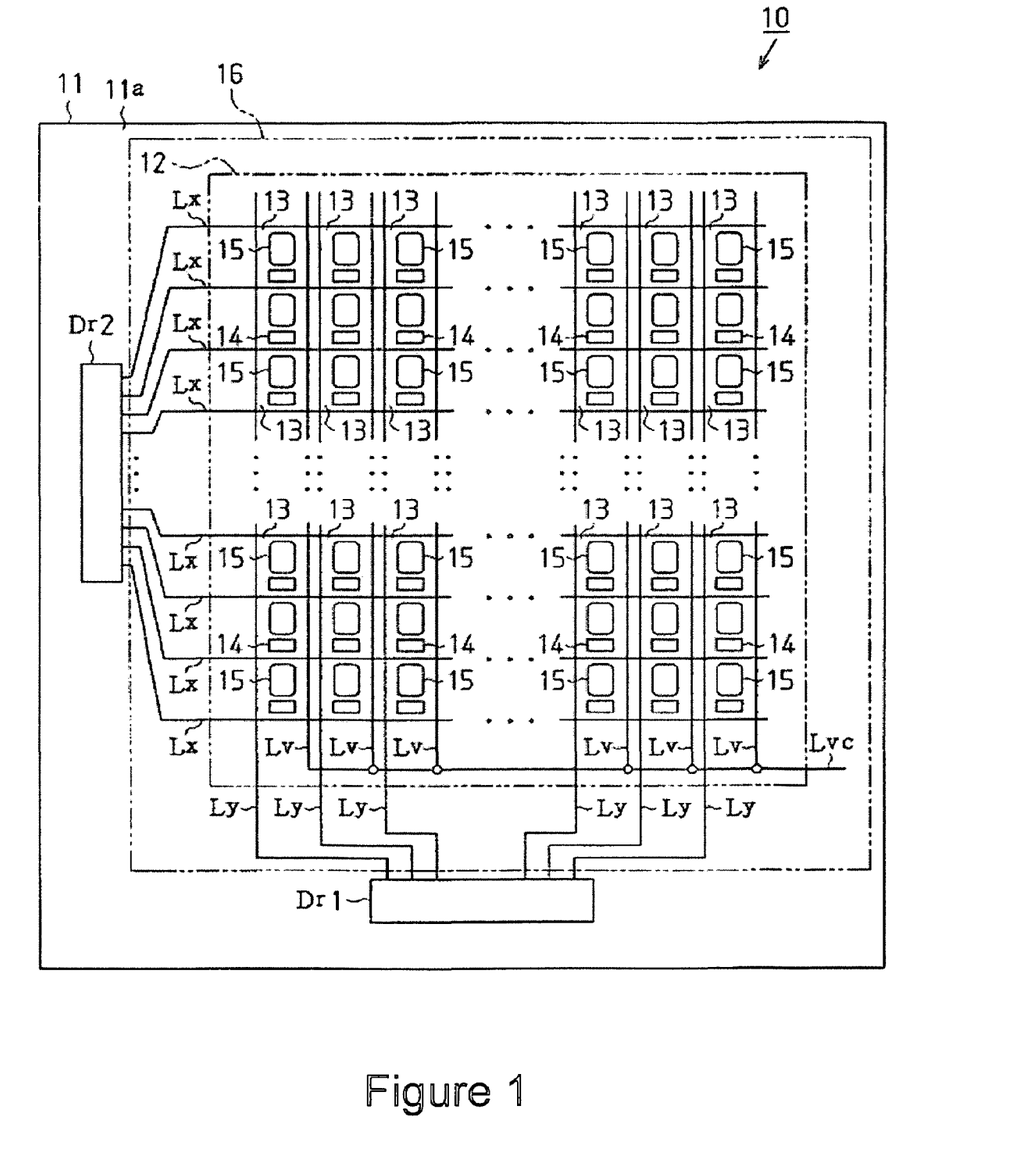
FIG. 1 is a simplified plan view of an organic EL display that is an embodiment of the present invention.

Specific embodiments of the invention will now be described through reference to FIGS. 1 to 10. FIG. 1 is a simplified plan view of an organic electroluminescence display (organic EL display) that serves as an electro-optical device.

As shown in FIG. 1, an organic EL display 10 is equipped with a transparent substrate 11 as a patterned substrate. The transparent substrate 11 is a non-alkaline glass substrate formed in the shape of a square, and a square element formation region 12 is formed on the surface thereof (element formation side 11a). In this element formation region 12, a plurality of data lines Ly are formed at a specific spacing and extending in the vertical direction (column direction). The data lines Ly are electrically connected to a data line drive circuit Dr1 disposed on the lower side of the transparent substrate 11. The data line drive circuit Dr1 produces a data signal on the basis of display data supplied from an external apparatus (not shown), and outputs this data signal at a specific timing to the data lines Ly corresponding to the data signal.

In the element formation region 12, a plurality of power lines Lv extending in the column direction are provided to the data lines Ly at a specific spacing. The power lines Lv are electrically connected to a common power line Lvc formed on the lower side of the element formation region 12, and drive power produced by a power supply voltage production circuit (not shown) is supplied to the power lines Lv.

A plurality of scanning lines Lx extending in the direction perpendicular to the data lines Ly and the power lines Lv (the row direction) are formed at a specific spacing in the element formation region 12. The scanning lines Lx are electrically connected to a scanning line drive circuit Dr2 formed on the left side of the transparent substrate 11. The scanning line drive circuit Dr2 selectively drives specific scanning lines Lx from among the plurality of scanning lines Lx at a specific timing on the basis of a scanning control signal supplied from a control circuit (not shown), and a scanning signal is outputted to the scanning lines Lx.

A plurality of pixels 13 arranged in a matrix are formed by connecting to the corresponding data lines Ly, power lines Lv, and scanning lines Lx where the data lines Ly and the scanning lines Lx intersect. A control element formation region 14 and a light emitting element formation region 15 are delineated within each of the pixels 13. The pixels 13 are protected by covering the top side of the element formation region 12 with a square sealing substrate 16 (the two-dot chain line in FIG. 1).

The pixels 13 in this embodiment are pixels that emit light of corresponding colors, and are either red pixels that emit red light, or green pixels that emit green light, or blue pixels that emit blue light. These pixels 13 are used to display a full-color image on the back side (display side 11b) of the transparent substrate 11.

Figure 2:
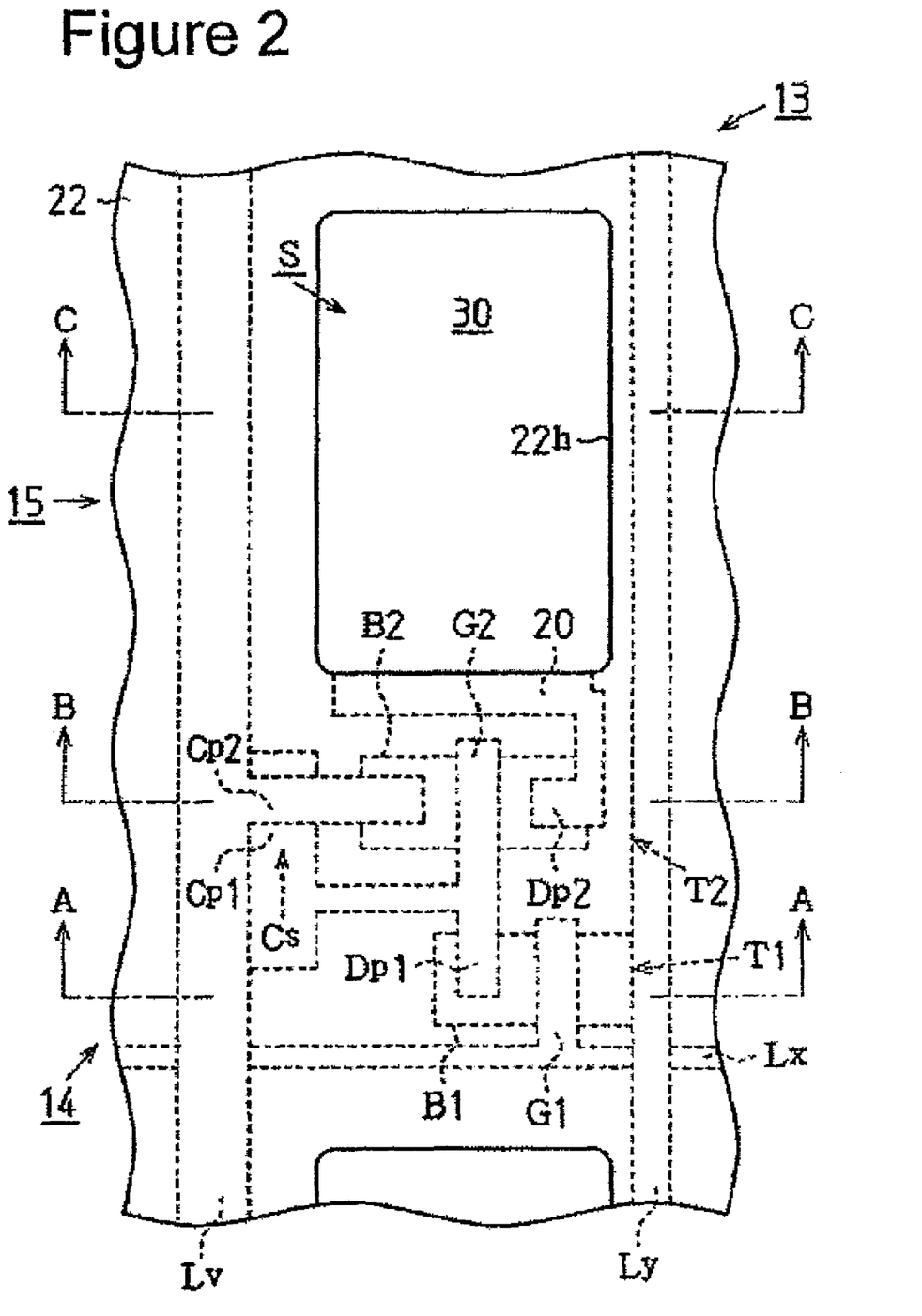
FIG. 2 is a simplified plan view of pixels in the same.
Figure 3:
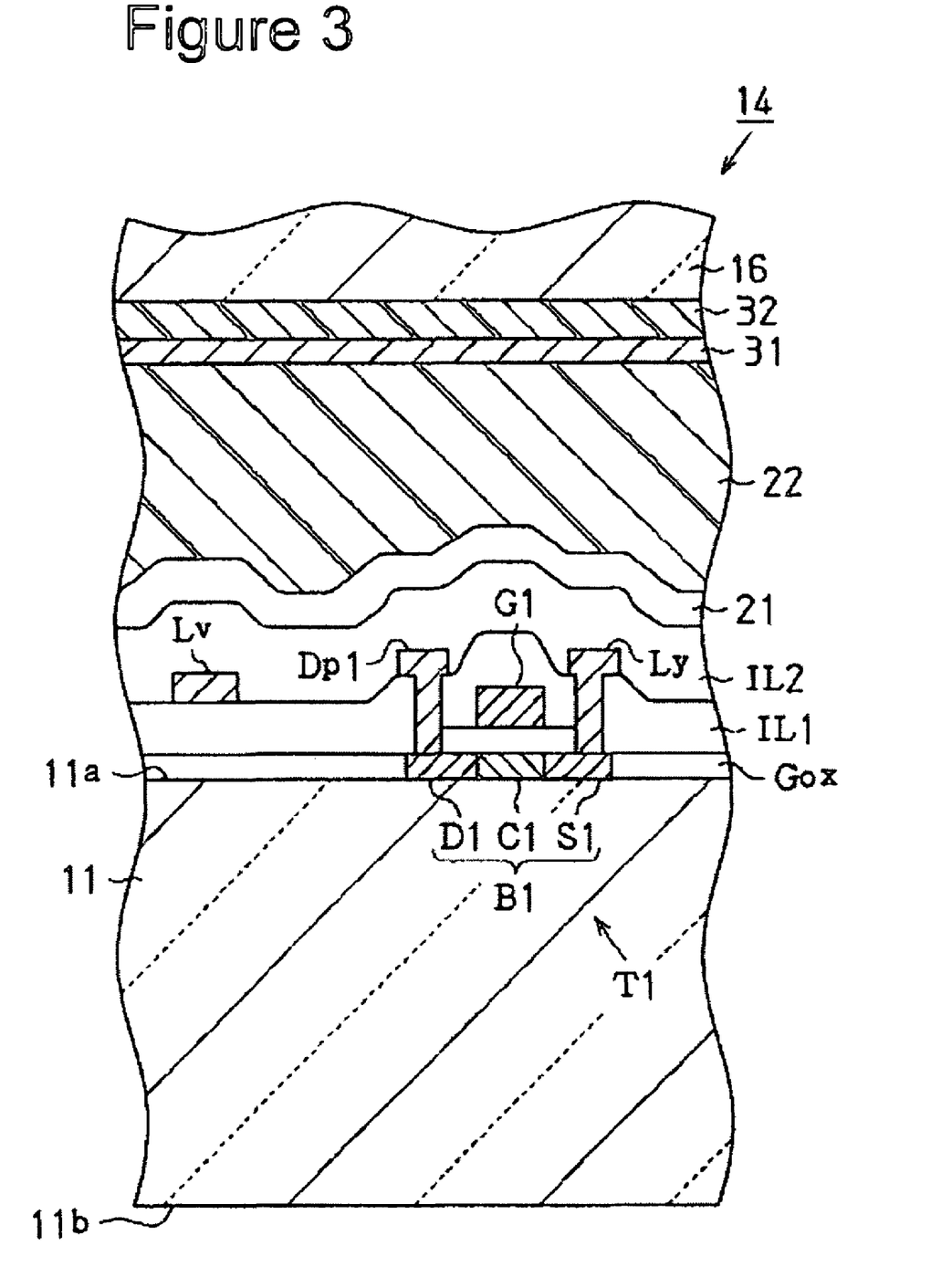
FIG. 3 is a simplified cross section of the control element formation region in the same.
Figure 4:
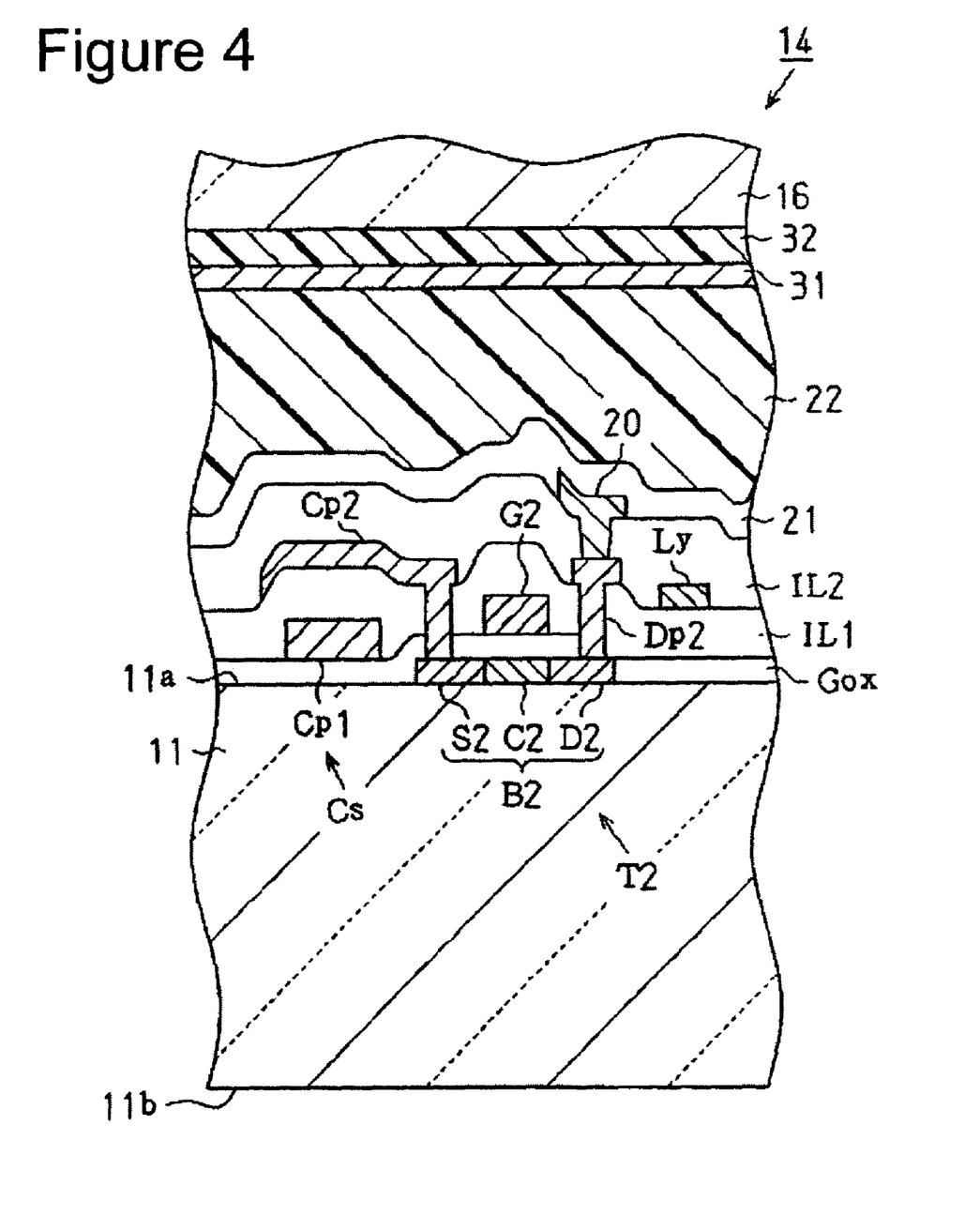
FIG. 4 is a simplified cross section of the control element formation region in the FIG. 5 is a simplified cross section of the light emitting element formation region in the same.
Figure 5:
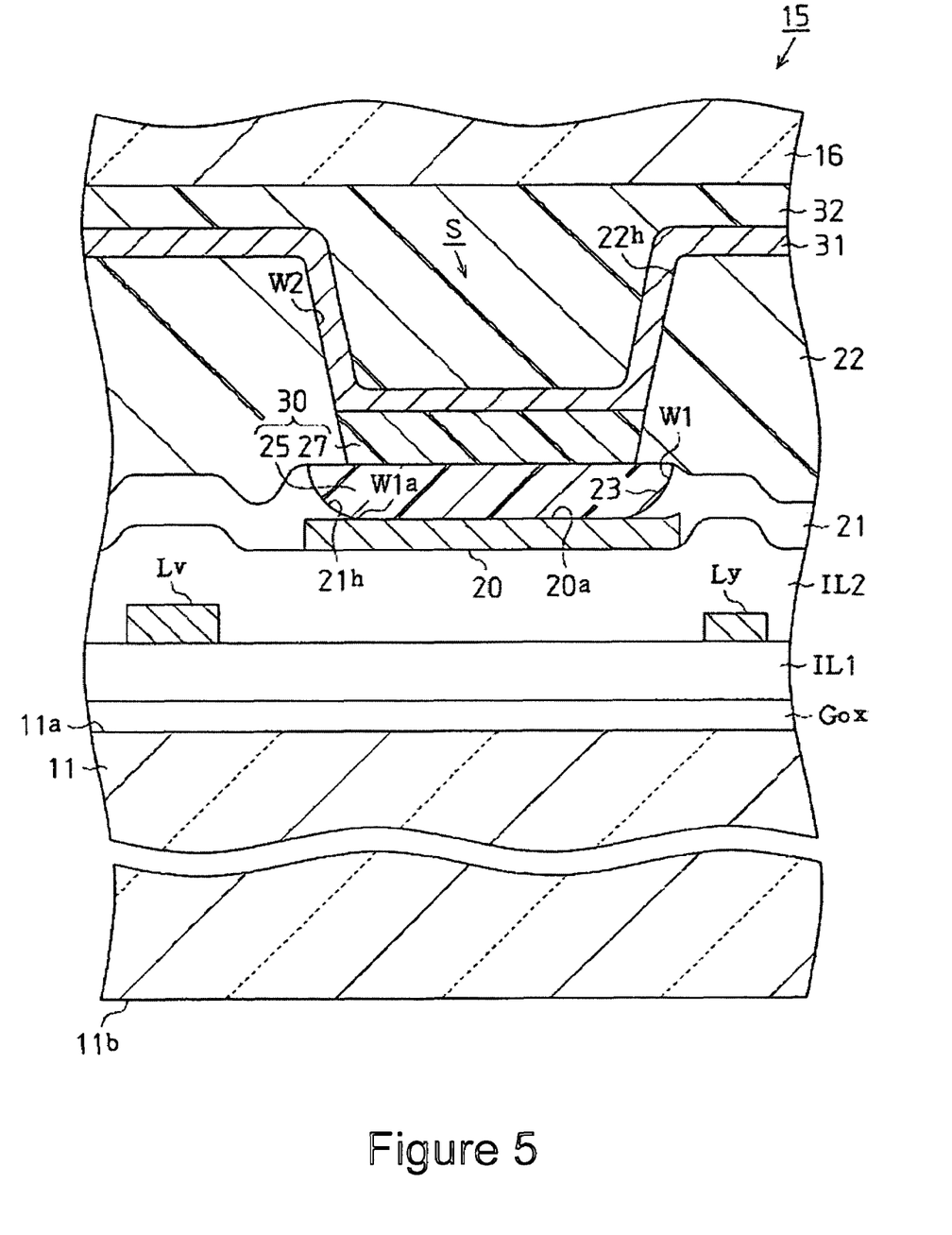

The pixels 13 will now be described. FIG. 2 is a simplified plan view of the layout of the control element formation region 14 and the light emitting element formation region 15. FIGS. 3 and 4 are simplified cross sections of the control element formation region 14 along the one-dot chain lines A-A and B-B, respectively, in FIG. 2. FIG. 5 is a simplified cross section of the light emitting element formation region 15 along the one-dot chain line C-C in FIG. 2.

First the structure of the control element formation regions 14 will be described. As shown in FIG. 2, a control element formation region 14 is formed on the lower side of each of the pixels 13, and a first transistor (switching transistor) T1, a second transistor (drive transistor) T2, and a holding capacitor Cs are formed in each control element formation region 14.

As shown in FIG. 3, the switching transistor T1 is equipped with a first channel film B1 at its lowermost layer. The first channel film B1 is a p-type polysilicon film formed in the shape of an island on the element formation side 11a, in the middle of which is formed a first channel region C1. Activated n-type regions (a first source region S1 and a first drain region D1) are formed flanking the first channel region C1 on the left and right sides. In other words, the switching transistor T1 is what is known as a polysilicon TFT.

A gate insulation film Gox and a first gate electrode G1 are formed on the upper side of the first channel region C1, in that order from the element formation side 11a. The gate insulation film Gox is a silicon oxide film or other such insulating film having optical transmissivity, and is deposited over substantially the entire surface of the element formation side 11a and the upper side of the first channel region C1. The first gate electrode G1 is a tantalum, aluminum, or other such low-resistance metal film, formed across from the first channel region C1, and is electrically connected to a scanning line Lx as shown in FIG. 2. As shown in FIG. 3, the first gate electrode G1 is electrically insulated by a first interlayer insulation film IL1 deposited on the upper side of the gate insulation film Gox.

When the scanning line drive circuit Dr2 inputs a scanning signal through the scanning line Lx to the first gate electrode G1, the switching transistor T1 is switched on by this scanning signal.

A data line Ly that goes through the first interlayer insulation film IL1 and the gate insulation film Gox is electrically connected to the first source region S1. A first drain electrode Dp1 that goes through the first interlayer insulation film IL1 and the gate insulation film Gox is electrically connected to the first drain region D1. As shown in FIG. 3, this data line Ly and first drain electrode Dp1 are electrically connected by a second interlayer insulation film IL2 deposited on the upper side of the first interlayer insulation film IL1.

The scanning line drive circuit Dr2 then successively selects the scanning lines Lx one at a time on the basis of line-order scanning, whereupon the switching transistor T1 of the pixel 13 is switched on in its turn and while selected. When the switching transistor T1 is switched on, the data signal outputted from the data line drive circuit Dr1 is outputted through the data line Ly and the switching transistor T1 (channel film B1) to the first drain electrode Dp1.

As shown in FIG. 4, the drive transistor T2 is a polysilicon TFT equipped with a second channel region C2, a second source region S2, and a second drain region D2. A second gate electrode G2 is formed via the gate insulation film Gox on the upper side of a second channel film B2 thereof. The second gate electrode G2 is a tantalum, aluminum, or other such low-resistance metal film, and as shown in FIG. 2, is electrically connected to a lower electrode Cp1 of the holding capacitor Cs and the first drain electrode Dp1 of the switching transistor T1. As shown in FIG. 4, the second gate electrode G2 and the lower electrode Cp1 are electrically connected by the first interlayer insulation film IL1 deposited on the upper side of the gate insulation film Gox.

The second source region S2 is electrically connected to an upper electrode Cp2 of the holding capacitor Cs that goes through the first interlayer insulation film IL1. As shown in FIG. 2, this upper electrode Cp2 is electrically connected to the corresponding power line Lv. In other words, as shown in FIGS. 2 and 4, the holding capacitor Cs, in which the first interlayer insulation film IL1 serves as a capacitance film, is connected between the second source region S2 and the second gate electrode G2 of the drive transistor T2. The second drain region D2 is electrically connected to a second drain electrode Dp2 that goes through the first interlayer insulation film IL1. The second drain electrode Dp2 and the upper electrode Cp2 are electrically connected by the second interlayer insulation film IL2 deposited on the upper side of the first interlayer insulation film IL1.

When the data signal outputted from the data line drive circuit Dr1 is outputted through the switching transistor T1 to the first drain region D1, the holding capacitor Cs stores a charge relative to the outputted data signal. Then, when the switching transistor T1 is switched off, a drive current relative to the charge stored in the holding capacitor Cs is outputted through the drive transistor T2 (channel film B2) to the second drain region D2.

Next, the structure of the light emitting element formation regions 15 will be described.

As shown in FIG. 2, a square light emitting element formation region 15 is formed on the upper side of each of the pixels 13. As shown in FIG. 5, a transparent electrode (anode) 20 is formed as a base layer on the upper side of the second interlayer insulation film IL2 in the light emitting element formation region 15.

The anode 20 is a transparent conductive film having optical transmissivity, such as an ITO film, one end of which goes through the second interlayer insulation film IL2 and is electrically connected to the second drain region D2, as shown in FIG. 4.

A third interlayer insulation film 21 is deposited (as a first barrier layer) on the upper side of the anode 20. This third interlayer insulation film 21 is formed from a material (such as a silicon oxide film) that is lyophilic to a hole layer droplet 25D (discussed below), and insulates the anodes 20 from each other. A square through-hole 21h that flares out upward is made in the approximate middle of the anode 20 in this third interlayer insulation film 21. The through-hole 21h is formed such that it widens outward in the planar direction of the anode 20 from the top side of the anode 20 upward.

A first barrier W1 (see FIG. 8) that is lyophilic with respect to the hole layer droplet 25D and widens outward in the planar direction of the anode 20 from the top side of the anode 20 is formed by the inner peripheral surface of the through-hole 21h. This first barrier W1 surrounds the top side of the anode 20, thereby forming a landing surface 20a delineated by the bottom W1a of the first barrier W1 on the top side of the anode 20.

A liquid-repellent film 22 is formed (as a second barrier layer) on the upper side of the third interlayer insulation film 21. The liquid-repellent film 22 is formed from what is called a positive photosensitive material, which when exposed to exposure light Lpr (see FIG. 7) of a specific wavelength, only the exposed portion becomes soluble in a developing solution such as an alkaline solution, and more specifically is formed from a fluororesin or the like that repels the hole layer droplet 25D and a light emitting layer droplet 27D (discussed above).

A receptacle hole 22h that flares out upward from a position across from the bottom W1a of the first barrier W1 is formed in the liquid-repellent film 22. In other words, the above-mentioned through-hole 21h is formed downward (toward the landing surface 20a) from this receptacle hole 22h. The receptacle hole 22h is formed in a size that allows a microscopic hole layer droplet 25b and a microscopic light emitting layer droplet 27b (discussed below; see FIGS. 9 and 10) to be accommodated in the corresponding light emitting element formation region 15.

A second barrier W2 that repels the hole layer droplet 25D (see FIG. 9) and the light emitting layer droplet 27D (see FIG. 10), which are discussed below, and that holds the hole layer droplet 25D and the light emitting layer droplet 27D is formed by the inner peripheral surface of the receptacle hole 22h. This second barrier W2 surrounds the space over the landing surface 20a, thereby forming a droplet holding space S that permits the landing of the microscopic hole layer droplet 25b and the microscopic light emitting layer droplet 27b on the landing surface 20a.

The upper side of the through-hole 21h (first barrier W1) is covered by the liquid-repellent film 22 equipped with the receptacle hole 22h, and the through-hole 21h contracts downward from the receptacle hole 22h, so that a recessed groove 23 (serves as a recess) that extends outward in the planar direction of the landing surface 20a is formed by the outer periphery of the landing surface 20a.

A hole transport layer 25 (hereinafter referred to simply as the hole layer 25) is formed as a pattern, whose outer edge is the recessed groove 23 (first barrier W1), in the through-hole 21h and over the landing surface 20a. This hole layer 25 is a pattern composed of a hole layer formation material 25s (as a pattern formation material and a light emitting element formation material) (see FIG. 9).

The hole layer formation material 25s in this embodiment is, for example, a benzidine derivative, styrylamine derivative, triphenylmethane derivative, triphenylamine derivative, hydrazone derivative, or other such low-molecular weight compound, or a high-molecular weight compound whose structure partly includes one of these, or polyaniline, polythiophene, polyvinylcarbazole, α-naphthylphenyldiamine, a mixture of poly(3,4-ethylenedioxythiophene) and polystyrenesulfonic acid (PEDOT/PSS) (Baytron P, trademark of Bayer), or another such high-molecular weight compound.

A light emitting layer 27 is laminated in the receptacle hole 22h over the hole layer 25. The light emitting layer 27 in this embodiment is formed from a light emitting layer formation material of the corresponding color (a red light emitting layer formation material that emits red light, a green light emitting layer formation material that emits green light, or a blue light emitting layer formation material that emits blue light). Examples of the red light emitting layer formation material include a high-molecular weight compound having an alkyl or alkoxy substituent on the benzene ring of a polyvinylenestyrene derivative, or a high-molecular weight compound having a cyano group on the vinylene group of a polyvinylenestyrene derivative. Examples of the green light emitting layer formation material include a polyvinylenestyrene derivative in which an alkyl, alkoxy, or allyl derivative substituent has been introduced into a benzene ring. Examples of the blue light emitting layer formation material include a polyfluorene derivative (such as a copolymer of dialkylfluorene and anthracene, or a copolymer of dialkylfluorene and thiophene).

An organic electroluminescence layer (organic EL layer) 30 is formed by the hole layer 25 and the light emitting layer 27.

A cathode 31 is formed as a back electrode composed of an optically reflective metal film, such as aluminum, on the upper side of the liquid-repellent film 22 (second barrier W2) and the upper side of the organic EL layer 30. The cathode 31 is formed so as to cover the entire surface of the element formation side 11a, and supplies potential for all of the light emitting element formation regions 15 shared by the pixels 13.

Specifically, an organic electroluminescence element (organic EL element) is constituted as a light emitting element by the anode 20, the organic EL layer 30, and the cathode 31.

When drive current corresponding to the data signal is supplied through the second drain region D2 to the anode 20, the organic EL layer 30 emits light at a brightness corresponding to this drive current. Here, the light emitted from the organic EL layer 30 toward the cathode 31 side (the upper side in FIG. 4) is reflected by the cathode 31. Accordingly, almost all of the light emitted from the organic EL layer 30 is transmitted through the anode 20, the second interlayer insulation film IL2, the first interlayer insulation film IL1, the gate insulation film Gox, the element formation side 11a, and the transparent substrate 11, and is emitted outward from the back (the display side 11b) of the transparent substrate 11. Specifically, an image based on the data signal is displayed on the display side 11b of the organic EL display 10.

An adhesive layer 32 composed of an epoxy resin or the like is formed on the upper side of the cathode 31, and a sealing substrate 16 that covers the element formation region 12 is applied via this adhesive layer 32. The sealing substrate 16 is a non-alkaline glass substrate, and serves to prevent the oxidation and so forth of the pixels 13 and the wiring lines Lx, Ly, and Lv.

Method for Manufacturing Organic EL Display 10

Figure 6:
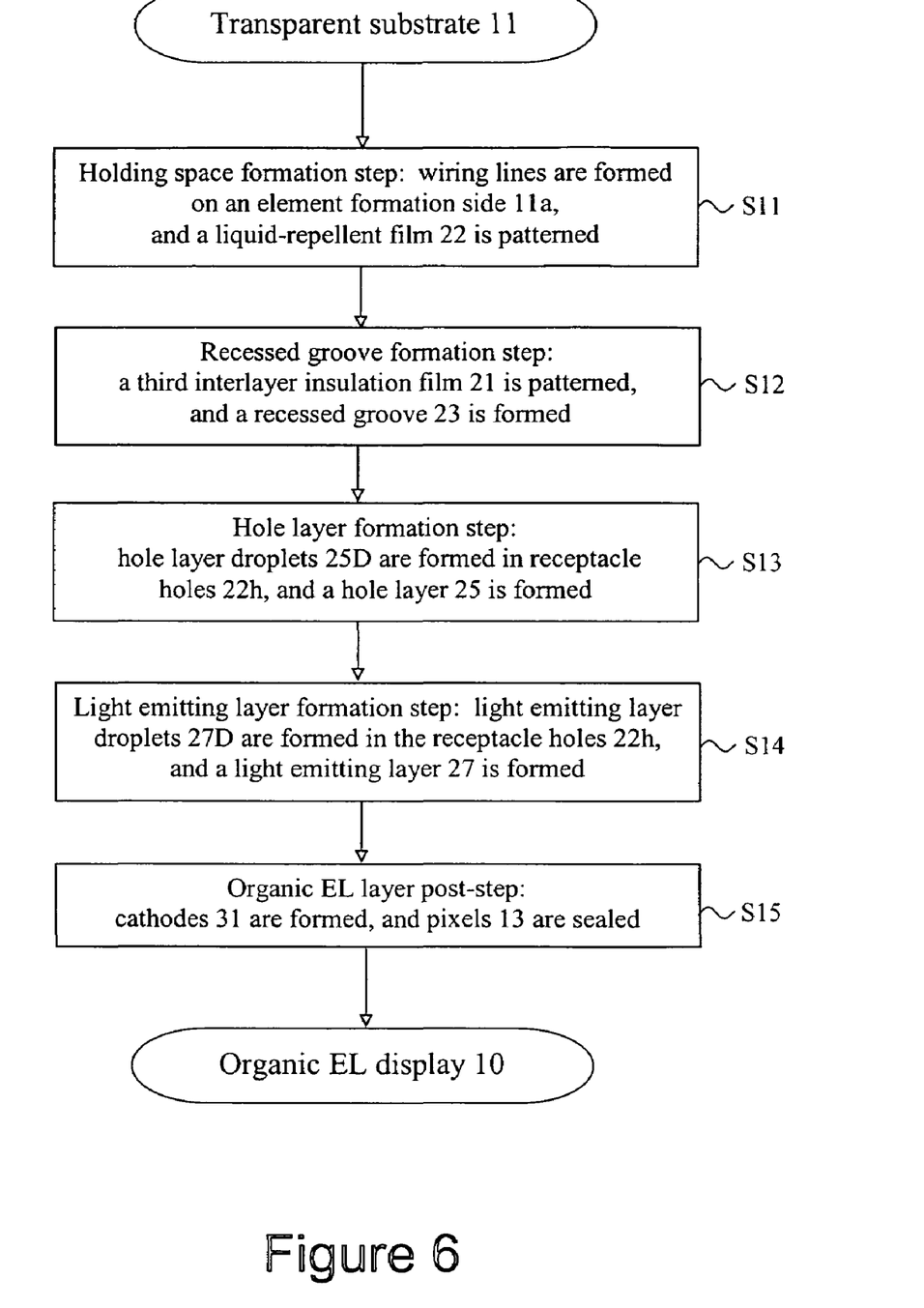
FIG. 6 is a flowchart of the steps of manufacturing an electro-optical device in the same.

Next, the method for manufacturing the organic EL display 10 will be described. FIG. 6 is a flowchart illustrating the method for manufacturing the organic EL display 10, and FIGS. 7 to 10 are diagrams illustrating this method for manufacturing the organic EL display 10.

Figure 7:
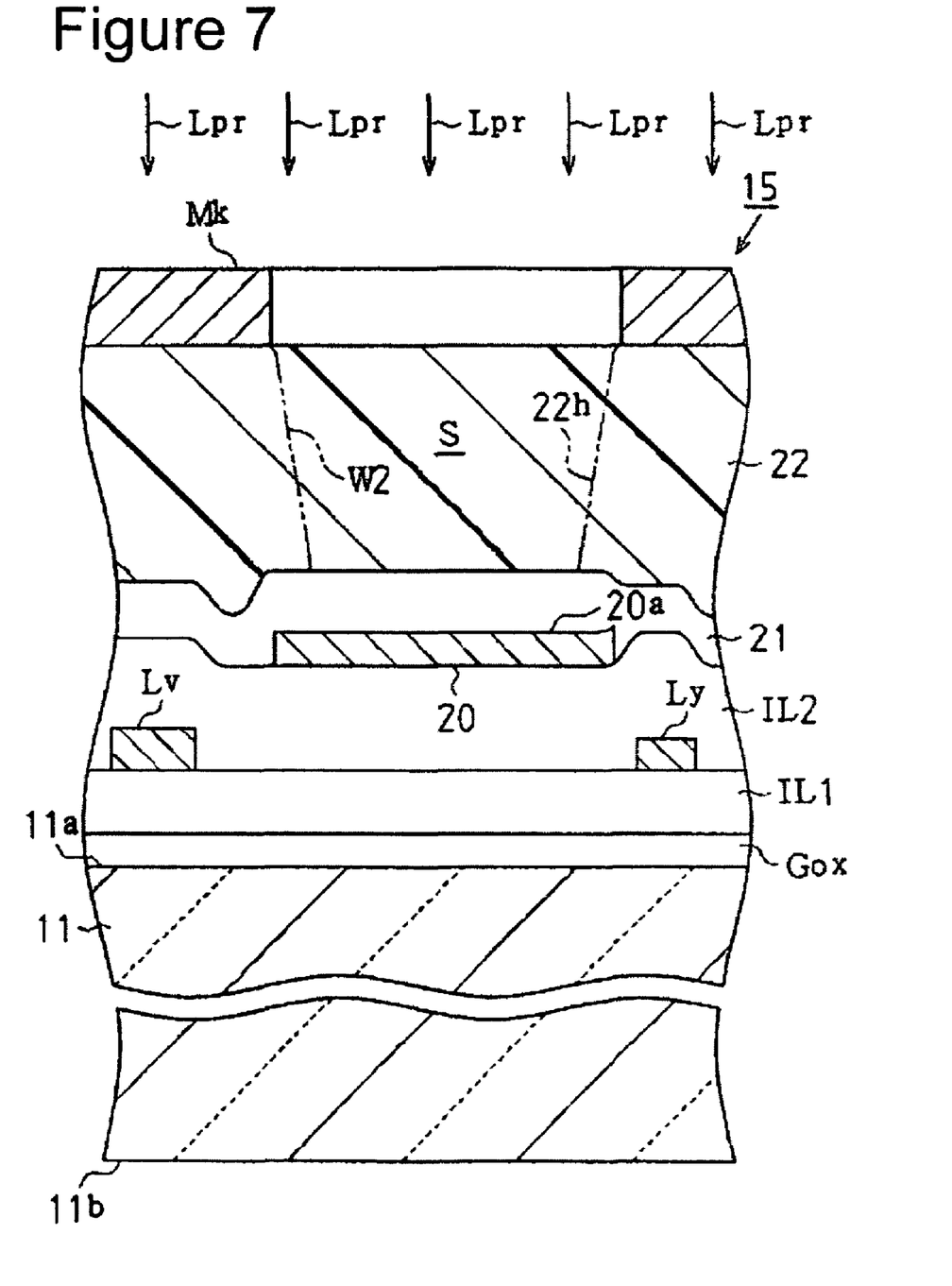
FIG. 7 is a diagram illustrating the steps of manufacturing an electro-optical device in the same.

As shown in FIG. 6, first a holding space formation step (step S11) is performed, in which the wiring lines Lx, Ly, Lv, and Lvc and the transistors T1 and T1 are formed on the element formation side 11a of the transparent substrate 11, and the liquid-repellent film 22 is patterned to form the droplet holding space S. FIG. 7 is a diagram illustrating the organic EL layer preliminary step.

Specifically, in the organic EL layer preliminary step, first a crystallized polysilicon film is formed by excimer laser or the like over the entire element formation side 11a, and this polysilicon film is patterned to form the channel films B1 and B2. Next, the gate insulation film Gox composed of a silicon oxide film or the like is formed over the entire upper surface of the element formation side 11a and the channel films B1 and B2, and a low-resistance metal film of tantalum or the like is deposited over the entire upper surface of the gate insulation film Gox. This low-resistance metal film is patterned to form the gate electrodes G1 and G2, the lower electrode Cp1 of the holding capacitor Cs, and the scanning line Lx.

When the gate electrodes G1 and G2 have been formed, an n-type impurity region is formed in each of the channel films B1 and B2 by ion doping, using the gate electrodes G1 and G2 as masks. This forms the channel regions C1 and C2, the source regions S1 and S2, and the drain regions D1 and D2. When the source regions S1 and S2 and the drain regions D1 and D2 have been formed in the channel films B1 and B2, respectively, the first interlayer insulation film IL1 composed of a silicon oxide film or the like is deposited over the entire upper surface of the gate electrodes G1 and G2, the scanning line Lx, and the gate insulation film Gox.

When the first interlayer insulation film IL1 has been deposited, a pair of contact holes is patterned at positions relative to the source regions S1 and S2 and the drain regions D1 and D2 in the first interlayer insulation film IL1. Next, a metal film of aluminum or the like is deposited over the entire upper surface of the first interlayer insulation film IL1 and in these contact holes, and this metal film is patterned to form the data line Ly and the upper electrode Cp2 of the holding capacitor Cs corresponding to each of the source regions S1 and S2. At the same time, the drain electrodes Dp1 and Dp2 corresponding to the drain regions D1 and D2 are formed. The second interlayer insulation film IL2 composed of a silicon oxide film or the like is deposited over the entire upper surface of the data line Ly, the upper electrode Cp2, the drain regions D1 and D2, and the first interlayer insulation film IL1. This forms the switching transistor T1 and the drive transistor T2.

When the second interlayer insulation film IL2 has been deposited, a via hole is formed at a position across from the second drain region D2 in this second interlayer insulation film IL2. Then, a transparent conductive film having optical transmissivity, such as an ITO film, is deposited over the entire upper surface of the second interlayer insulation film IL2 and in this via hole, and this transparent conductive film is patterned to form the anode 20 that connects to the second drain region D2. When the anode 20 has been formed, the third interlayer insulation film 21 composed of a silicon oxide film or the like is formed over the entire upper surface of the second interlayer insulation film IL2 and this anode 20.

When the third interlayer insulation film 21 has been deposited, as shown in FIG. 7, the entire upper surface of the third interlayer insulation film 21 is coated with a photosensitive polyimide resin or the like to form the liquid-repellent film 22. Developing is then performed by exposing the liquid-repellent film 22 at a position across from the anode 20 to exposure light Lpr of a specific wavelength through a mask Mk, which results in the patterning of the receptacle hole 22h, whose inner peripheral surface is the second barrier W2, in this liquid-repellent film 22.

Figure 8:
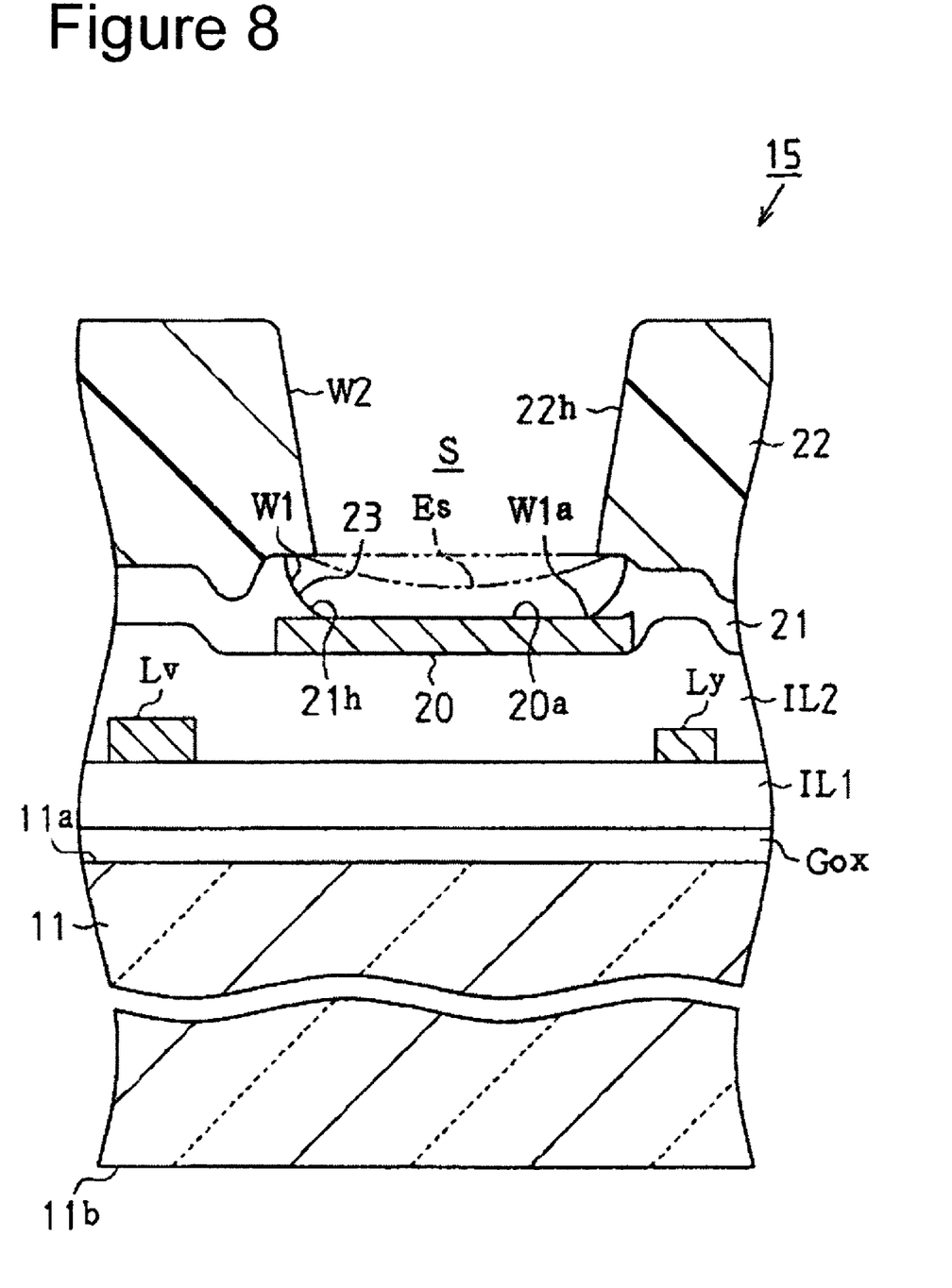
FIG. 8 is a diagram illustrating the steps of manufacturing an electro-optical device in the same.

As shown in FIG. 6, when the holding space formation step is complete (step S11), a recessed groove formation step (step S12) is performed, in which the third interlayer insulation film 21 is patterned to form the recessed groove 23. FIG. 8 is a diagram illustrating this recessed groove formation step.

Specifically, in the recessed groove formation step, the third interlayer insulation film 21 is isotropically etched using the liquid-repellent film 22 as a mask. As a result, as shown in FIG. 8, an etching surface Es is formed in an approximate arc shape in the third interlayer insulation film 21 from the liquid-repellent film 22 side, and eventually this forms the first barrier W1 that flares out from the anode 20 side. When etching is concluded once the size of the bottom W1a is substantially the same as the size of the droplet holding space S (receptacle hole 22h) on the anode 20 side, the through-hole 21h equipped with the first barrier W1 is formed on the top side of the anode 20, and the landing surface 20a surrounded by the bottom W1a is formed. The recessed groove 23 extending outward in the planar direction of the landing surface 20a is formed in the outer periphery of this landing surface 20a. This allows the position of the first barrier W1 to be adjusted with respect to the second barrier W2 (droplet holding space S).

Figure 9:
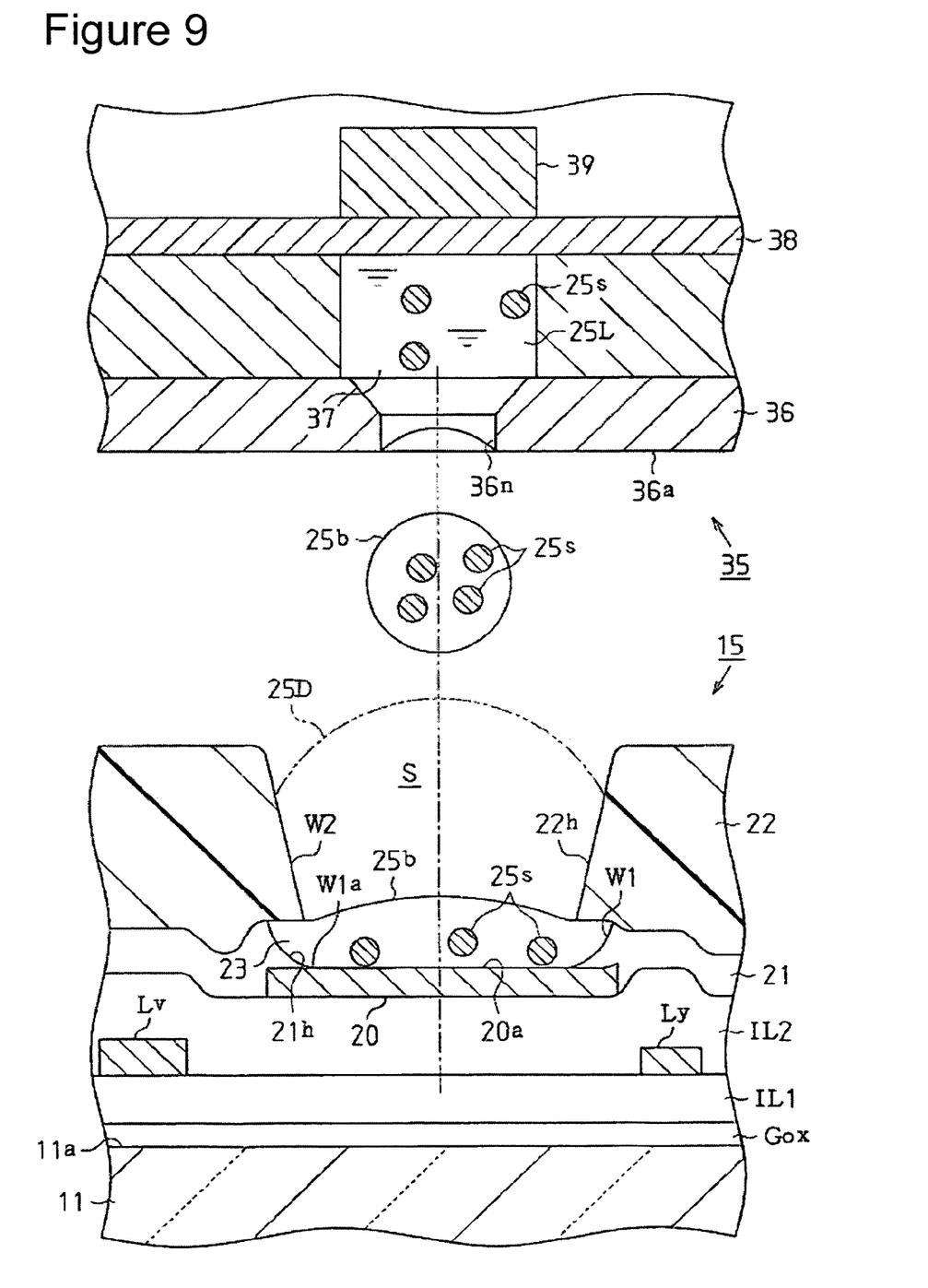
FIG. 9 is a diagram illustrating the steps of manufacturing an electro-optical device in the same.

As shown in FIG. 6, when the recessed groove 23 has been formed (step S12), a hole layer formation step (step S13) is performed, in which the hole layer droplet 25D containing the hole layer formation material 25s is formed in the receptacle hole 22h, and the hole layer 25 is formed. FIG. 9 is a diagram illustrating this hole layer formation step.

First, the structure of the droplet discharge apparatus used to form the hole layer droplet 25D will be described.

As shown in FIG. 9, a liquid discharge head 35 that constitutes the droplet discharge apparatus in this embodiment is equipped with a nozzle plate 36. Numerous nozzles 36n for discharging a liquid are formed facing upward on the bottom side (the nozzle formation side 36a) of this nozzle plate 36. A liquid supply chamber 37 that communicates with a liquid reservoir (not shown) and allows a liquid to be supplied to the nozzles 36n is formed on the upper side of the nozzles 36n. A diaphragm 38 that vibrates reciprocally up and down and expands and contracts the volume inside the liquid supply chamber 37 is provided on the upper side of the liquid supply chamber 37. A piezoelectric element 39 that vibrates the diaphragm 38 by expanding and contracting vertically is provided on the upper side of each diaphragm 38 at a position across from the liquid supply chamber 37.

As shown in FIG. 9, a transparent substrate 11 conveyed to the droplet discharge apparatus is positioned with its element formation side 11a parallel to the nozzle formation side 36a and with the center of the receptacle holes 22h disposed directly under each of the nozzles 36n.

Here, a hole layer formation solution 25L produced by dissolving the hole layer formation material 25s is supplied into the liquid supply chamber 37.

When a drive signal for forming the hole layer droplet 25D is inputted to the liquid discharge head 35, the piezoelectric element 39 expands or contracts according to this drive signal, thereby increasing or decreasing the volume of the liquid supply chamber 37. If the volume of the liquid supply unit 37 decreases here, the hole layer formation solution 25L is discharged as a microscopic hole layer droplet 25b from the nozzle 36n in an amount corresponding to the reduction in volume. The discharged microscopic hole layer droplet 25b goes through the droplet holding space S and lands on the landing surface 20a in the through-hole 21h. When the volume of the liquid supply chamber 37 then increases, the hole layer formation solution 25L is supplied from a liquid reservoir (not shown) into the liquid supply chamber 37 in an amount equal to the increase in volume. In other words, the liquid discharge head 35 discharges the required volume of hole layer formation solution 25L toward the receptacle hole 22h by means of the expansion and contraction of the liquid supply chamber 37. Here, the liquid discharge head 35 discharges the microscopic lower layer droplet 25b in an amount such that the hole layer formation material 25s contained in the hole layer droplet 25D will form a film of the desired thickness.

The microscopic hole layer droplet 25b that lands on the landing surface 20a comes into contact with the first barrier W1, and wets and spreads out along the recessed groove 23 due to the surface tension (capillary force) of the first barrier W1 on the microscopic hole layer droplet 25b. Specifically, because the recessed groove 23 is formed so that it widens outward in the planar direction of the landing surface 20a, there is a corresponding increase in the range over which the surface tension acts on the microscopic hole layer droplet 25b, and the microscopic hole layer droplet 25b uniformly wets and spreads out over the entire landing surface 20a.

The microscopic hole layer droplet 25b that uniformly wets and spreads out over the landing surface 20a eventually forms the hole layer droplet 25D, which has a hemispherical surface, because of the surface tension and the liquid repellency of the second barrier W2, as shown by the two-dot chain line in FIG. 9.

When the hole layer droplet 25D has been formed, the transparent substrate 11 (the hole layer droplet 25D) is placed under a specific reduced pressure to dry the hole layer droplet 25D and solidify the hole layer formation material 25s. The solidified hole layer formation material 25s forms the hole layer 25 in a uniform shape, according to the amount of uniform wetting and spreading over the entire top side of the anode 20. As a result, the hole layer 25 is formed in a uniform shape over the entire landing surface 20a within the through-hole 21h.

Figure 10:
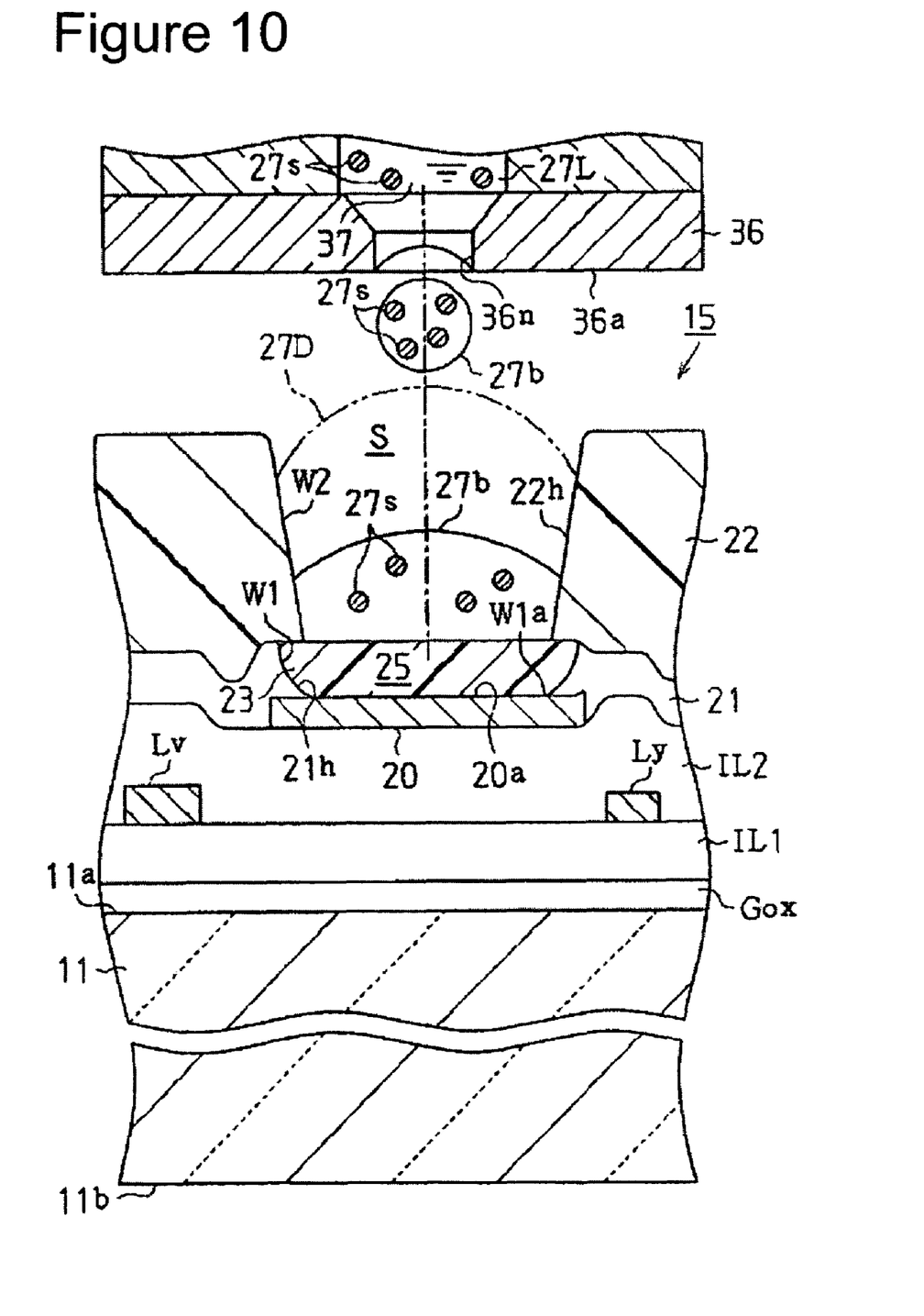
FIG. 10 is a diagram illustrating the steps of manufacturing an electro-optical device in the same.

As shown in FIG. 6, when the hole layer 25 has been formed (step S13), a light emitting layer formation step (step S14) is performed in which the light emitting layer 27 is formed in the receptacle hole 22h. FIG. 10 is a diagram illustrating the light emitting layer formation step.

In this light emitting layer formation step, as shown in FIG. 10, just as in the hole layer formation step, a microscopic light emitting layer droplet 27b of the light emitting layer formation solution 27L containing a light emitting layer formation material 27s of the corresponding color is discharged from each nozzle 36n onto the corresponding hole layer 25, and the light emitting layer droplet 27D formed by the discharged microscopic light emitting layer droplet 27b is dried to form the light emitting layer 27.

Here, the microscopic light emitting layer droplet 27b discharged on the hole layer 25 uniformly wets and spreads out over the surface and makes the shape of the light emitting layer 27 uniform, that is, makes the shape of the organic EL layer 30 uniform, according to how uniformly the shape of the hole layer 25 is formed by the recessed groove 23.

As shown in FIG. 6, when the hole layer 25 (organic EL layer 30) has been formed (step S14), an organic EL layer post-step (step S15) is performed, in which the cathode 31 is formed over the light emitting layer 27 (organic EL layer 30) and the liquid-repellent film 22, and the pixel 13 is sealed. Specifically, the cathode 31 composed of a metal film such as aluminum is deposited over the entire top side of the organic EL layer 30 and the liquid-repellent film 22, forming an organic EL element composed of the anode 20, the organic EL layer 30, and the cathode 31. When the organic EL element has been formed, an adhesive layer 32 is formed by coating the entire top side of the cathode 31 (pixel 13) with an epoxy resin or the like, and the sealing substrate 16 is applied to the transparent substrate 11 via this adhesive layer 32.

The result of the above is that an organic EL display 10 in which the organic EL layer 30 has a uniform shape can be manufactured.

Next, the effects of this embodiment, constituted as above, will be described.

With the above embodiment, the third interlayer insulation film 21 composed of a lyophilic material was formed on the landing surface 20a side of the second barrier W2 forming the droplet holding space S, and the through-hole 21h was formed in this third interlayer insulation film 21. The inner peripheral surface (first barrier W1) of the through-hole 21h was formed so that it widened outward in the planar direction of the landing surface 20a from the landing surface 20a side, and the recessed groove 23 consisting of the first barrier W1 was formed on the outer periphery of the landing surface 20a.

Therefore, the surface tension (capillary force) of the recessed groove 23 (first barrier W1) causes the microscopic hole layer droplet 25b that goes through the droplet holding space S and lands on the landing surface 20a to wet and spread out over the landing surface 20a.

Furthermore, because the first barrier W1 is formed so that widens outward in the planar direction, the contact area between the microscopic hole layer droplet 25b and the first barrier W1 is correspondingly larger, and the range over which the surface tension can act on the microscopic hole layer droplet 25b is expanded.

As a result, the shape of the hole layer 25 can be made more uniform, and the shape of the organic EL layer 30 can be made more uniform. This in turn increases the productivity of the organic EL display 10.

In this embodiment, the liquid-repellent film 22 was laminated over the third interlayer insulation film 21 to form the second barrier W2. Therefore, the hole layer droplet 25D and the light emitting layer droplet 27D can be effectively held in the droplet holding space S, without any leakage. Furthermore, since the second barrier W2 and the first barrier W1 constitute different members, there is greater latitude in choosing the material for wetting with the microscopic hole layer droplet 25b and the material for holding the hole layer droplet 25D. Accordingly, the shape of the organic EL layer 30 can be made more uniform, and the productivity of the organic EL display 10 can be increased.

With this embodiment, the through-hole 21h (first barrier W1) was formed by isotropically etching the third interlayer insulation film 21 using as a mask the liquid-repellent film 22 having the receptacle hole 22h (second barrier W2). Therefore, the position of the first barrier W1 can be adjusted with respect to the second barrier W2 (droplet holding space S), and the recessed groove 23 can be reliably formed around the entire outer periphery of the landing surface 20a. Accordingly, the shape of the organic EL layer 30 can be made more uniform.

Furthermore, since the third interlayer insulation film 21 can be etched without separately forming a mask for forming the first barrier W1, the step of forming the first barrier W1 can be eliminated. This in turn increases the productivity of the organic EL display 10.

With this embodiment, the hole layer droplet 25D was formed by the microscopic hole layer droplet 25b discharged from a droplet discharge apparatus. Therefore, the desired amount of microscopic light emitting layer droplet 27b can be reliably discharged into the droplet holding space S, so the organic EL layer 30 can be formed in a more uniform shape than with other liquid phase processes (such as spin coating).

The above embodiment may be modified as follows.

In the above embodiment, the position of the bottom W1a of the first barrier W1 was across from the landing surface 20a side of the receptacle hole 22h, but is not limited to this, and the position of the bottom W1a may instead be disposed more toward the center of the landing surface 20a than that shown in FIG. 5, so that the bottom W1a is formed at a position across from the receptacle hole 22h. This further increases the contact area between the first barrier W1 and the microscopic hole layer droplet 25b that goes through the receptacle hole 22h (droplet holding space S) and lands on the landing surface 20a, and allows the microscopic hole layer droplet 25b to wet and spread out more effectively.

In the above embodiment, the first barrier W1 was formed so that it widen outward in the planar direction of the landing surface 20a from its bottom W1a, but is not limited to this, and may instead have a shape in which the recessed groove 23 is formed by covering the liquid-repellent film 22 having the receptacle hole 22h. Alternatively, it may be formed so that it narrows outward in the planar direction of the landing surface 20a from its bottom W1a, that is, so that it protrudes to the inside of the landing surface 20a.

With this patterned substrate, because the first barrier is formed so that it narrows from a position across from the droplet holding space toward the second barrier, the area that is lyophilic to the droplets is corresponding larger, and the droplets discharged from the droplet holding space can wet and spread out more effectively.

In the above embodiment, the through-hole 21h (first barrier W1) was formed using as a mask the liquid-repellent film 22 having the receptacle hole 22h, but is not limited to his, and the receptacle hole 22h may instead be formed after the first barrier W1 has been formed.

In the above embodiment, the first barrier W1 and the second barrier W2 were formed from different members (the third interlayer insulation film 21 and the liquid-repellent film 22), but the invention is not limited to this, and the first barrier W1 and the second barrier W2 may instead constitute the same member.

In the above embodiment, the pattern was embodied as the hole layer 25, but its not limited to this, and may instead be the light emitting layer 27, for example, or may be a color filter of various colors formed by droplets.

In the above embodiment, the organic EL display 10 was embodied as a bottom emission type, but is not limited to this, and may involve a top emission type instead. Specifically, the recessed groove 23 may be formed on a back electrode.

In the above embodiment, the organic EL layer 30 was formed by an inkjet method, but the invention is not limited to this, and the method for forming the organic EL layer 30 may instead be such that, for example, the hole layer droplet 25D or the light emitting layer droplets 27D are formed by a liquid applied by spin coating or another such method, and the organic EL layer 30 is formed by drying and solidifying this liquid.

In the above embodiment, the control element formation region 14 was equipped with the switching transistor T1 and the drive transistor T2, but is not limited to this, and the constitution may instead be such that a single transistor, or numerous transistors, or numerous capacitors are used, according to the desired element design.

In the above embodiment, the organic EL layer 30 was formed by an inkjet method, but the invention is not limited to this, and the method for forming the organic EL layer 30 may instead be spin coating or another such method, and the organic EL layer 30 may be formed by drying and solidifying a liquid.

In the above embodiment, the microscopic hole layer droplets 25b were discharged by the piezoelectric elements 39, but the invention is not limited to this, and a resistance heating element may be provided to the liquid supply chamber 37, for example, and the microscopic hole layer droplets 25b may be discharged by bursting the bubbles formed by the heating of this resistance heating element.

In the above embodiment, the electro-optical device was embodied as the organic EL display 10, but is not limited to this, and may instead be a backlight mounted in a liquid crystal panel, for example, or may be a field effect type of display (FED, SED, etc.) that is equipped with a flat electron emission element, and that utilizes the ability of a fluorescent substance to emit light as a result of the electrons emitted from this element.

This application claims priority to Japanese Patent Application No. 2004-368871. The entire disclosure of Japanese Patent Application No. 2004-368871 is hereby incorporated herein by reference.

What is claimed is:

1. A patterned substrate, comprising:
a base layer;
a barrier formed over the base layer having first and second wall surfaces with the first wall surface being disposed between the base layer and the second wall surface, and the second wall surface defining a droplet holding space disposed on an inner side of the second wall surface; and
a pattern formed by discharging droplets containing a pattern formation material into the droplet holding space surrounded by the barrier,
the first wall surface of the barrier being lyophilic with respect to the droplets and at least part of the first wall surface that contacts the droplets being disposed on an outer side of the second wall surface in a planar direction of the base layer to define a recess that expands outward with respect to the second wall surface in the planar direction of the base layer.

2. The patterned substrate according to claim 1, wherein the barrier includes a first barrier having the first wall surface formed over the base layer and a second barrier having the second wall surface formed over the first barrier,
the droplet holding space is formed by the second barrier, and
the recess is formed by the first barrier, which is located farther outside in the planar direction than the second barrier.

3. The patterned substrate according to claim 2, wherein the first barrier is formed such that it gradually widens outward in the planar direction from a position across from the droplet holding space of the base layer toward the second barrier.

4. The patterned substrate according to claim 2, wherein the first barrier is formed such that it gradually narrows in the planar direction from a position across from the droplet holding space of the base layer toward the second barrier.

5. The patterned substrate according to claim 2, wherein the first barrier is lyophilic with respect to the droplets, and the second barrier repels the droplets.

6. The patterned substrate according to claim 1, wherein the pattern formation material is a light emitting element formation material, and the pattern is a light emitting element.

7. The patterned substrate according to claim 1, wherein the pattern formation material is a color filter formation material, and the pattern is a color filter.

8. An electro-optical device comprising:
a base layer;
a barrier formed over the base layer having first and second wall surfaces with the first wall surface being disposed between the base layer and the second wall surface, and the second wall surface defining a droplet holding space disposed on an inner side of the second wall surface; and
a light emitting element formed by discharging droplets containing a light emitting element formation material into the droplet holding space surrounded by the barrier,
the first wall surface of the barrier being lyophilic with respect to the droplets and at least part of the first wall surface that contacts the droplets being disposed on an outer side of the second wall surface in a planar direction of the base layer to define a recess that expands outward with respect to the second wall surface in the planar direction of the base layer.

9. The electro-optical device according to claim 8, wherein
the barrier includes a first barrier having the first wall surface formed over the base layer and a second barrier having the second wall surface formed over the first barrier,
the droplet holding space is formed by the second barrier, and
the recess is formed by the first barrier, which is located farther outside in the planar direction than the second barrier.

10. The electro-optical device according to claim 9, wherein
the first barrier is formed such that it gradually widens outward in the planar direction from a position across from the droplet holding space of the base layer toward the second barrier.

11. The electro-optical device according to claim 10, wherein
the first barrier is lyophilic with respect to the droplets, and the second barrier repels the droplets.

12. The electro-optical device according to claim 9, wherein
the light emitting element is an electroluminescence element equipped with a light emitting layer between a transparent electrode and a back electrode.

13. The electro-optical device according to claim 12, wherein
the light emitting element is an organic electroluminescence element equipped with a light emitting layer composed of an organic material.

14. The electro-optical device according to claim 12, wherein
the base layer is either the transparent electrode or the back electrode.

15. A method for manufacturing an electro-optical device, comprising:
forming a barrier having first and second wall surfaces on a base layer with the first wall surface being disposed between the base layer and the second wall surface, and the second wall surface defining a droplet holding space disposed on an inner side of the second wall surface; and
forming a light emitting element by discharging droplets containing a light emitting element formation material into the droplet holding space,
the forming of the barrier including forming the barrier with the first wall surface being lyophilic with respect to the droplets and at least part of the first wall surface that contacts the droplets being disposed on an outer side of the second wall surface in a planar direction of the base layer to define a recess that expands outward with respect to the second wall surface in the planar direction of the base layer.

16. The method for manufacturing an electro-optical device according to claim 15, wherein
the forming of the barrier includes laminating a second barrier layer over a first barrier layer on the base layer, patterning the second barrier layer to form a second barrier having the second wall surface surrounding the droplet holding space, and patterning the first barrier layer to form a first barrier having the first wall surface positioned farther outside in the planar direction than the second barrier.

17. The method for manufacturing an electro-optical device according to claim 16, wherein
the first barrier is formed by using the second barrier as a mask and isotropically etching the first barrier layer.

18. The method for manufacturing an electro-optical device according to claim 15, wherein
the base layer is either a transparent electrode or a back electrode, and
the light emitting element is an electroluminescence element having a light emitting layer between the transparent electrode and the back electrode.

19. The method for manufacturing an electro-optical device according to claim 16, wherein
the light emitting element is an organic electroluminescence element equipped with a light emitting layer composed of an organic material.

20. The method for manufacturing an electro-optical device according to claim 15, wherein
the droplets are discharged from a droplet discharge apparatus.

\* \* \* \* \*